(12) United States Patent
Hoeink et al.

(10) Patent No.: US 10,267,123 B2
(45) Date of Patent: Apr. 23, 2019

(54) DIRECTIONAL PERMEABILITY UPSCALING OF A DISCRETE FRACTURE NETWORK

(71) Applicants: Tobias Hoeink, Houston, TX (US); Yuxing Ben, Houston, TX (US)

(72) Inventors: Tobias Hoeink, Houston, TX (US); Yuxing Ben, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 606 days.

(21) Appl. No.: 15/006,281

(22) Filed: Jan. 26, 2016

(65) Prior Publication Data
US 2016/0215594 A1    Jul. 28, 2016

Related U.S. Application Data

(60) Provisional application No. 62/107,625, filed on Jan. 26, 2015.

(51) Int. Cl.
| | |
|---|---|
| *E21B 41/00* | (2006.01) |
| *G06F 17/10* | (2006.01) |
| *E21B 43/00* | (2006.01) |
| *G06F 17/50* | (2006.01) |

(52) U.S. Cl.
CPC .......... *E21B 41/0092* (2013.01); *E21B 43/00* (2013.01); *G06F 17/10* (2013.01); *G06F 17/5009* (2013.01); *Y02C 10/14* (2013.01)

(58) Field of Classification Search
USPC .................................................. 703/2, 5, 6
See application file for complete search history.

(56) References Cited

U.S. PATENT DOCUMENTS

| | | |
|---|---|---|
| 7,565,278 B2 | 7/2009 | Li et al. |
| 2012/0158380 A1 | 6/2012 | Hajibeygi et al. |
| 2013/0124169 A1 | 5/2013 | Sung |

(Continued)

OTHER PUBLICATIONS

Durlofsky, Louis J.; "Upscaling and Gridding of Fine Scale Geological Models for Flow Simulation"; Paper presented at the 8th International Forum on Reservoir Simulation Iles Borromees, Stresa, Italy; Jun. 20-24, 2005; 59 pages.

(Continued)

*Primary Examiner* — Thai Q Phan
(74) *Attorney, Agent, or Firm* — Cantor Colburn LLP

(57) ABSTRACT

A method for estimating an upscaled directional permeability of a formation includes: receiving a discrete fracture network (DFN), aligning the DFN in a desired direction; cropping the DFN to a desired size having boundaries. The method further includes identifying a fracture plane or fracture planes that are connected with each other and establish a path between the boundaries of the cropped DFN and creating a pipe model of the identified fracture plane or planes that includes one or more conduits connecting one boundary to another boundary. The method further includes creating a system of equations representing flows through the conduits, applying boundary conditions to the system of equations; solving the system of equations for steady-state flow to estimate the upscaled directional permeability of the formation. The method steps can be iterated for another desired direction if the upscaled directional permeability is wanted for the another desired direction.

20 Claims, 9 Drawing Sheets

(56) References Cited

U.S. PATENT DOCUMENTS

2013/0204588 A1  8/2013  Copeland

OTHER PUBLICATIONS

Elfeel, et al.; "Static and Dynamic Assessment of DFN Permeability Upscaling"; SPE154369; 2012; Society of Petroleum Engineers; 16 pages.

Gong, et al.; "Upscaling Discrete Fracture Characterizations to Dual-Porosity, Dual-Permeability Models for Efficient Simulation of Flow with Strong Gravitational Effects";2008; SPE Journal; Society of Petroleum Engineers; 10 pages.

Ishibashi, et al.; "Development of Discrete Fracture Network Model Simulator, GeoFlow, for Evaluation of Three Dimensioinal Channeling Flow"; 2009; International Petroleum Tecnology Conference; 6 pages.

Karimi-Fard, et al.; "Generation of Coarse-Scale Continuum Flow Models From Detailed Fracture Characterizations"; Water Resources Research, vol. 42.; 2006; The American Geophysical Union; 13 pages.

Long, et al.; "A Model for Steady Fluid Flow in Random Three-Dimensional Networks of Disc-Shaped Fractures"; Water Resources Research, vol. 21 No. 8; Aug. 1985; The American Geophysical Union; 11 pages.

Meyer, et al.; "A Discrete Fracture Network Model for Hydraulically Induced Fractures: Theory Parametric and Case Studies"; SPE 140514; 2011; Society of Petrleum Engineers; 36 pages.

Ruehr, Otto G.; "Unsteady State Flow in Pipeline Networks"; SPE 1636; 1966; Society of Petroleum Engineers; 4 pages.

Santizo, Manuel Cossio; "A Semi-Analytic Solution for Flow in Finite-Conductivity Vertical Fractures Using Fractal Theory"; Aug. 2012; 119 pages.

Zhou, et al.; "Semianalytical production Simulation of Complex Hydraulic-Fracture Networks"; Feb. 2014; SPE Journal; Society of Petroleum Engineers; 13 pages.

DIRECTIONAL PERMEABILITY UPSCALING OF A DISCRETE FRACTURE NETWORK

CROSS REFERENCE TO RELATED APPLICATIONS

This application claims the benefit of an earlier filing date from U.S. Provisional Application Ser. No. 62/107,625 filed Jan. 26, 2015, the entire disclosure of which is incorporated herein by reference.

BACKGROUND

Earth formations may be used for various purposes such as hydrocarbon production, geothermal production, and carbon dioxide sequestration. In order to efficiently employ resources for using an earth formation, it is necessary to know the permeability of the formation. Permeability relates to a value that characterizes the ability of the formation to transmit fluids through the formation. For hydrocarbon production purposes, the fluids are generally transmitted from a reservoir in the formation to a borehole penetrating the formation.

Reservoir engineers use the permeability of a formation to plan for well locations and their depths as well as extraction flow rates among other engineering decisions. In general, fluids flow through fractured rock in the formation. Because these fractures can have various orientations, the value of permeability is generally a function of direction. Hence, by knowing the directional permeability of a formation or of different portions of the formation, the reservoir engineer can more accurately plan wells and thus make a more efficient use of expensive production resources.

BRIEF SUMMARY

Disclosed is a method for estimating an upscaled directional permeability of a formation. The method includes: receiving a discrete fracture network (DFN), the DFN a plurality of rock fractures and a location, size, orientation and aperture of each of the rock fractures; aligning the DFN in a desired orientation or direction; cropping the DFN to a desired size having boundaries; identifying a fracture plane or fracture planes that are connected with each other and establish a path between the boundaries of the cropped DFN; creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary; creating a system of equations representing flows through the conduits; applying boundary conditions to the system of equations; solving the system of equations for steady-state flow to estimate the upscaled directional permeability of the formation; iterating the aligning, cropping, identifying, creating a pipe model, creating a system of equations, applying and solving for another desired orientation or direction if the up scaled directional permeability is wanted for the another desired orientation or direction; performing a borehole and/or formation-related action using the estimated upscaled directional permeability of the formation and associated action-equipment; wherein the aligning, cropping, identifying, creating a pipe model, creating a system of equations, applying and solving are performed using a processor.

Also disclosed is a system for estimating an upscaled directional permeability of a formation. The system includes a memory having computer-readable instructions and a processor for executing the computer-readable instructions. The computer-readable instructions include: receiving a discrete fracture network (DFN), the DFN a plurality of rock fractures and a location, size, orientation and aperture of each of the rock fractures; aligning the DFN in a desired orientation or direction; cropping the DFN to a desired size having boundaries; identifying a fracture plane or fracture planes that are connected with each other and establish a path between the boundaries of the cropped DFN; creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary; creating a system of equations representing flows through the conduits; applying boundary conditions to the system of equations; solving the system of equations for steady-state flow to estimate the upscaled directional permeability of the formation; and iterating the aligning, cropping, identifying, creating a pipe model, creating a system of equations, applying and solving for another desired orientation or direction in response to a signal indicating the upscaled directional permeability is to be estimated for the another desired orientation or direction. The system further includes equipment configured to perform a borehole and/or formation-related action using the estimated upscaled directional permeability of the formation.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed is a method for estimating a directional permeability for a portion or section of an earth formation of interest. The earth formation of interest may be divided into sections, which may be two or three-dimensional, with a directional permeability being calculated for each section.

The permeability of adjacent sections may be used to determine the ability of fluids to flow through the adjacent sections and into a borehole penetrating the earth formation of interest. The borehole may be modeled in one or more of the sections such that the permeability of the formation at a boundary of the borehole can be estimated.

Figure 1:
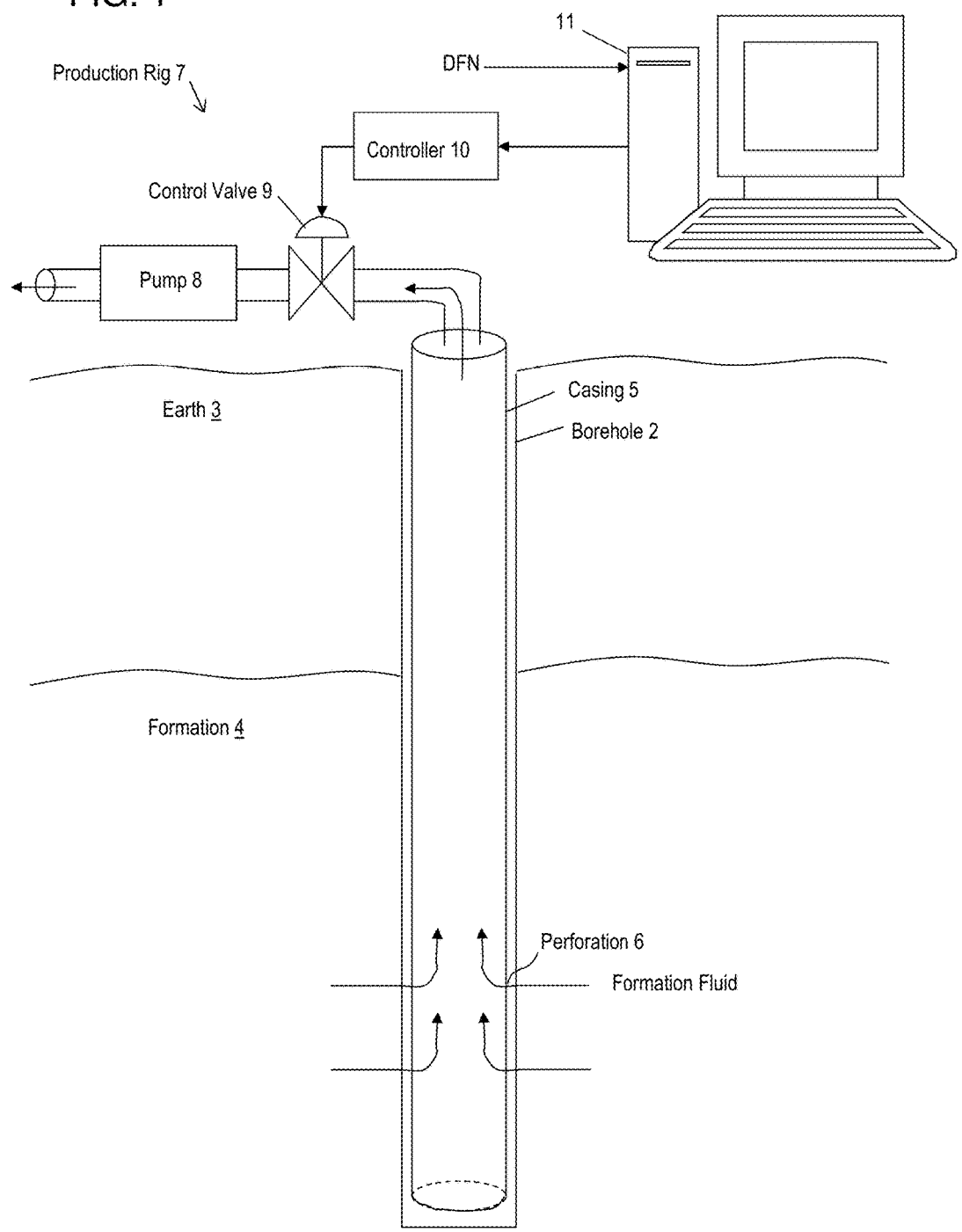
FIG. 1 illustrates a cross-sectional view of an embodiment of a borehole penetrating the earth.

FIG. 1 illustrates a cross-sectional view of a borehole 2 penetrating the earth 3 having a formation 4. A casing 5, having perforations 6, lines the borehole 2. The perforations 6 allows formation fluids such as hydrocarbons to enter the borehole 2 from which a production rig 7 can pump the formation fluids to the surface of the earth 3. The production rig 7 includes a pump 8 for pumping the formation fluids. A control valve 9 is configured to control the flow rate of the formation fluids being pumped. A controller 10 is configured to receive a control signal from a computer processing system 11 for controlling the flow rate to the extracted fluids. The flow rate is generally controlled by the controller in accordance with a flow rate set point as determined by the computer processing system using the estimated directional permeability of the formation 4. It can be appreciated that the production rig 7 may also include apparatus (not shown) configured to have drilled the borehole 2 or other boreholes in the future. Accordingly, the production rig 7 may include a drill tubular, drill bit, lift apparatus, drilling fluid pumping equipment, and other required apparatus. It can also be appreciated that the production rig 7 may be configured to apply reservoir stimulation treatments to the formation 4 such as hydraulic fracturing and acid stimulation for example.

Figure 2:
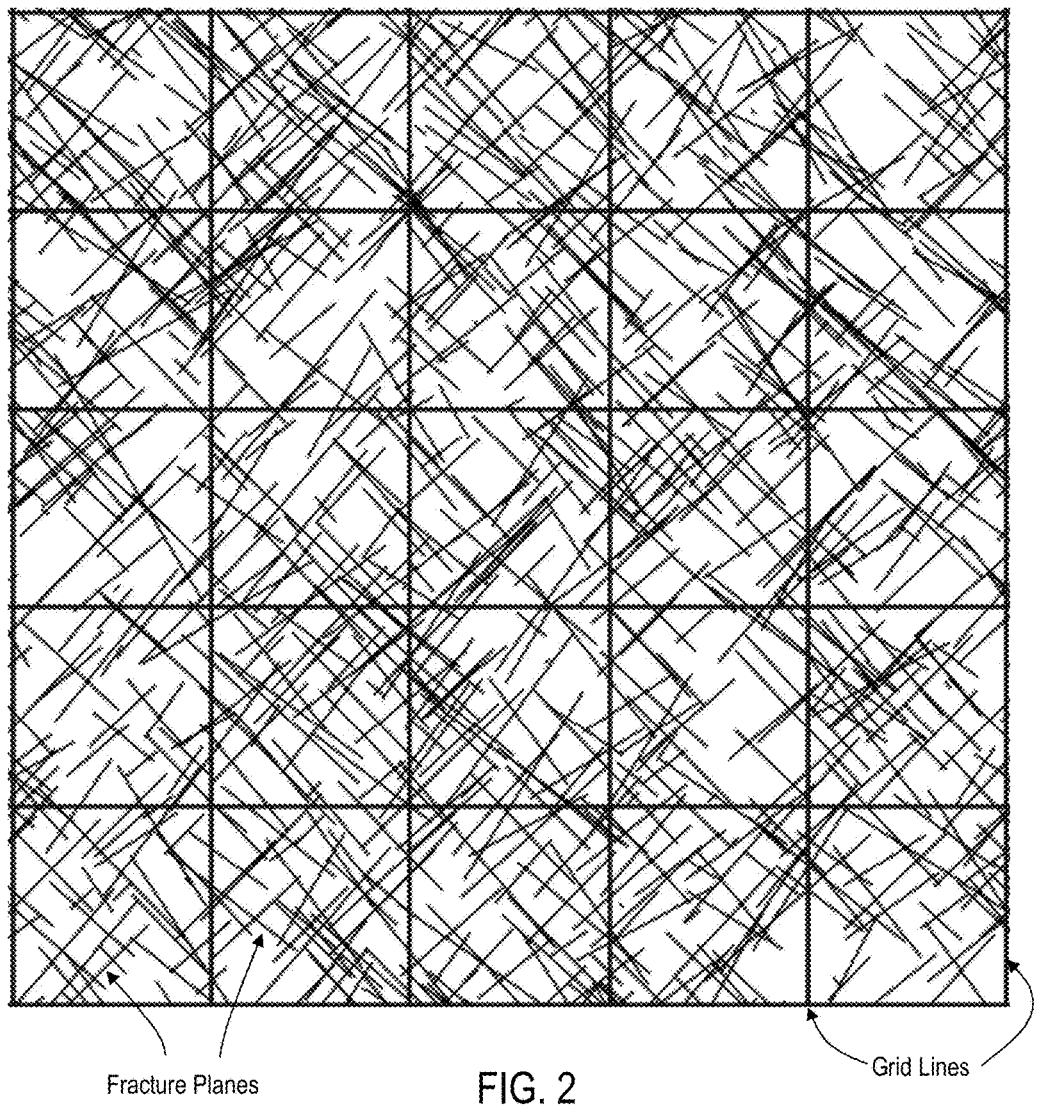
FIG. 2 depicts aspects of a discrete facture network.

FIG. 2 depicts aspects of a discrete fracture network (DFN) representing fractures of rock in the formation 4. The illustration in FIG. 2 may be representative of a top view or side view of the formation 4. Each fracture in the DFN is represented by a straight line. The straight line represents a fracture plane along which a rock has fractured. The fractured rock thus has two parallel or nearly parallel rock faces separated by a distance referred to as an aperture. Each fracture in the DFN is represented by a fracture plane having a location in the DFN, dimensions of the fracture plane, orientation and an aperture distance. The DFN can be divided into grid cells, which can be represented in either two dimensions or three dimensions. While the grid cells are illustrated as being the same size, the grid cells may have different sizes in the DFN. The size of the grid cells is usually determined by a reservoir engineer who performs reservoir simulations using reservoir modelling software executed on a computer processing system. In order to obtain computational efficiency with existing software and hardware, the grid cells generally contain a plurality of fractures. In one or more embodiments, the length or each side of a grid cell is on the order of ten meters.

The DFN can be obtained in any of several known techniques or combinations of those techniques. In one example, the number of fracture planes and each of their sizes, apertures, and locations can be determined in a core sample to provide a DFN for the core sample and the sample DFN can then be extrapolated out for the entire formation. In another example, a surface rock outcropping can be investigated to provide a DFN for the rock outcropping and the rock outcropping DFN can then be extrapolated out for the entire formation. In yet another example, an array of geophones can pick up the acoustic sounds of rock fracturing during a hydraulic fracturing process known as "fracking" and processing the receiving sounds to estimate a size and location of the fractures using a process similar to triangulation.

Figure 3:
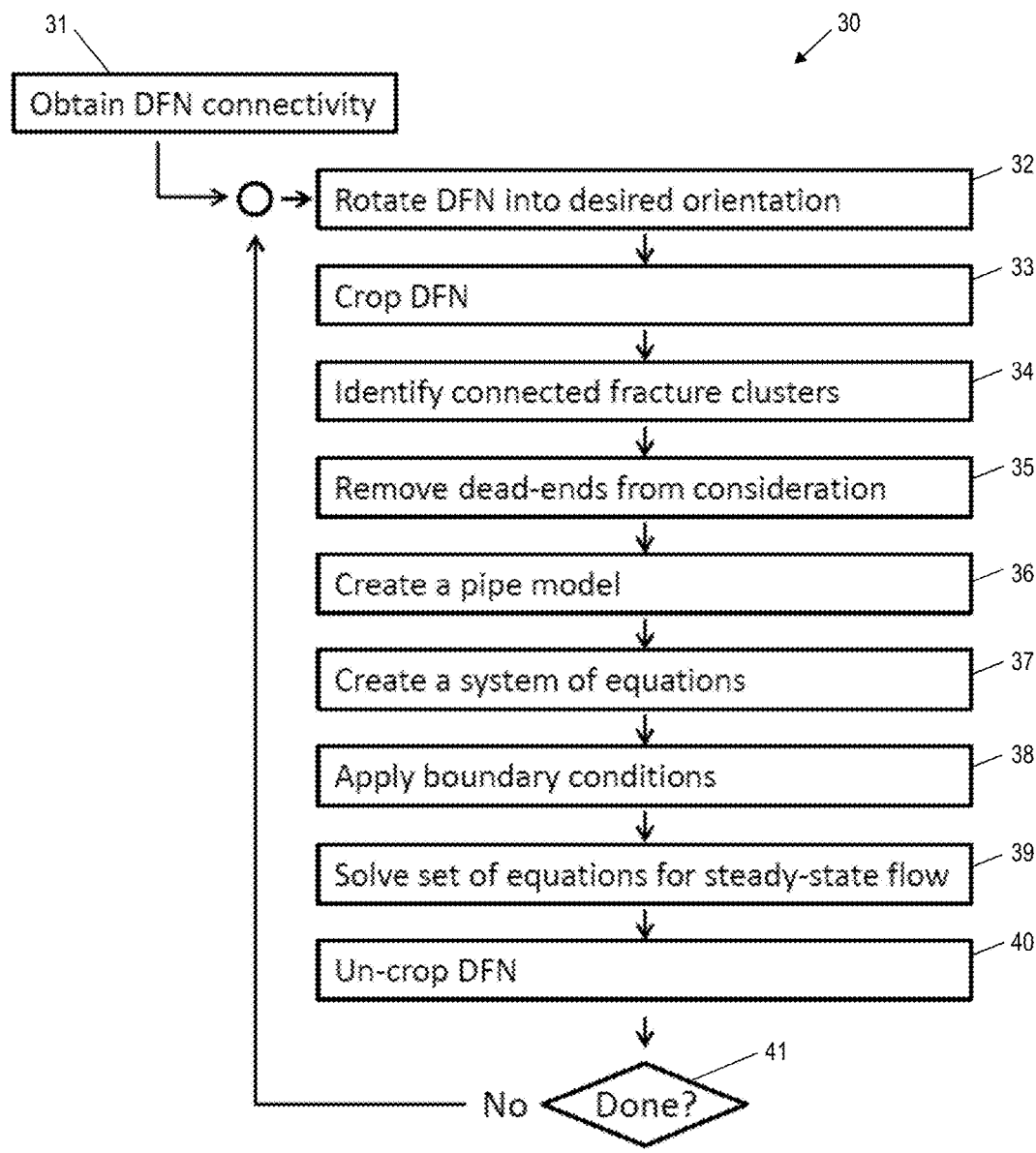
FIG. 3 is a flow chart for a method for estimating a directional permeability of a portion of an earth formation.

FIG. 3 is a flow chart for a method for estimating a directional permeability of a portion of an earth formation. Block 31 calls for obtaining a DFN where each fracture is represented by a fracture plane having a location, dimensions, orientation and aperture. The orientation of the fracture plane may be determined by the corresponding location and dimensions. For example, by knowing the location of points forming lines representing fracture planes the orientation or direction of the fracture planes can be determined. Block 32 calls for rotating or aligning the DFN into a desired orientation. In one or more embodiments, the desired orientation is a reference orientation specified by a reservoir engineer. In general, the rotating or aligning is performed with respect to a grid having grid cells where the grid is in the desired orientation. Block 33 calls for cropping the DFN. Cropping involves excluding fractures or parts of fractures that are outside of boundaries of a selected area or volume. In one or more embodiments, the selected area or volume is represented by a grid cell such that the grid lines of the grid cells form the boundaries of the selected area or volume. For example, each grid cell may be a square or cube with equal length sides or boundaries or each grid cell may be a rectangle or rectangular volume.

Block 34 calls for identifying a fracture plane or fracture planes that are connected with each other and establish a path between the boundaries of the selected area or volume. Block 35 calls for removing dead-ends from within the boundaries of the selected area or volume. Dead-ends are a fracture or connected fractures that do not provide a path between the boundaries of the selected area or volume. Hence, the dead-ends do not contribute to fluid flow from one boundary to another boundary of the selected area or volume.

Figure 6:
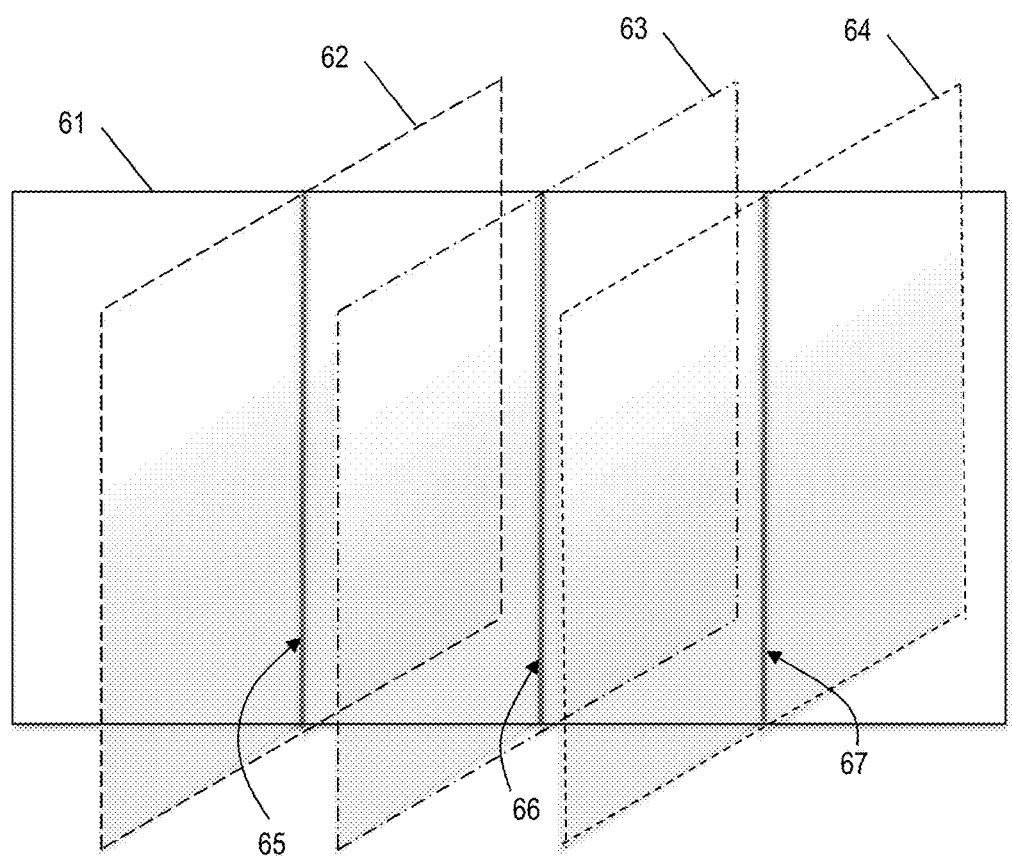
FIG. 6 depicts aspects of determining nodal points of fracture intersections.
Figure 7:
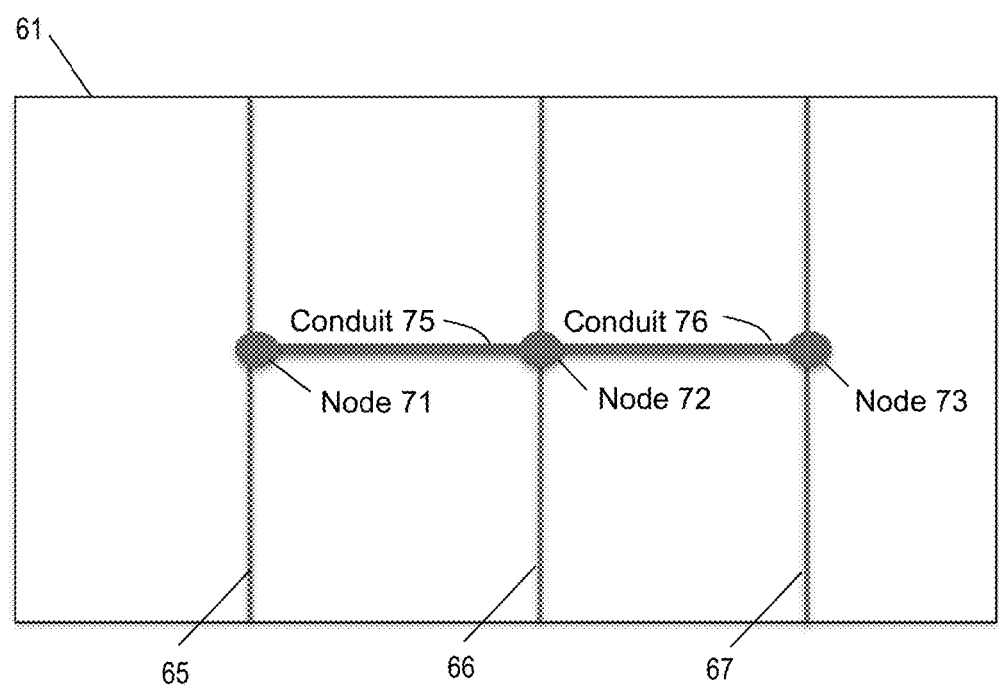
FIG. 7 depicts aspects of establishing pipes or conduits connecting the nodal points.

Block 36 calls for creating a pipe model of the fracture or fractures that are connected with each other and establish a path between the boundaries of the selected area or volume. One example of generating the pipe model is discussed with reference to FIGS. 6 and 7. FIG. 6 illustrates four fracture planes 61, 62, 63 and 64. Fracture plane 61 is in the plane of the page while fracture planes 62, 63 and 64 intersect fracture plane 61 and protrude at an angle from the plane of the page. A line is drawn along each of the intersections of the fracture planes. The length of each line corresponds to the length of each intersection. Line 65 is at the intersection of fracture planes 61 and 62, line 66 is at the intersection of fracture planes 61 and 63, and line 67 is at the intersection of fracture planes 61 and 64. Next, a node is placed somewhere along each of the intersection lines. In one or more embodiments, each node is placed at a midpoint along the corresponding intersection line as illustrated in FIG. 7. Nodes may also be placed in pipes or conduits at the intersection of those pipes or conduits at a boundary. In FIG. 7, a node 71 is placed at the midpoint of line 65, a node 72 is placed at the midpoint of line 76, and a node 73 is placed at the midpoint of line 67. Next, a pipe or conduit is generated connecting each node (i.e., a first node) to an adjacent node (i.e., a second node) that is in fluid communication with the first node. FIG. 7 illustrates a pipe/conduit 75 connecting nodes 71 and 72 and a pipe/conduit 76 connecting nodes 72 and 73. Each pipe/conduit represents a fluid flow path within the aperture of the corresponding fracture plane. The term "conduit" is used to clarify that the flow connection between nodes can be any shape such as a slot formed between parallel plates and may not be a round pipe shape.

Block 37 calls for creating a system of equations representing flows through the pipes. In one or more embodiments, the equations are based on a mass conservation principle such that flow into a pipe equals the flow out of the pipe. Pressure differential across ends of a pipe represents a driving force to cause fluid to flow throw that pipe. In one or more embodiments, the flow equations model fluid flow through parallel plates separated by the aperture distance rather than flow through a round pipe. Other conduit configurations for fluid flow may also be modeled. The following equation may be used to model flow through parallel plates. The steady-state volume flux of viscous fluid flowing between two parallel plates (which define a slot) is $$Q = \frac{1}{12\mu} \frac{(p_1 - p_2)}{l} a^3$$

where $\mu$ is the fluid viscosity, $p_1$ and $p_2$ are the pressures on either side or end of the slot defined by the parallel plates, $l$ is the length of the plates in flow direction, and $a$ is the distance between the two plates. SI units of Q are m²/s.

Block 38 calls for applying boundary conditions to the system of equations. In one or more embodiments, the boundary conditions are a pressure at a pipe node in the pipe model at a boundary of the cropped DFN. For example for each pipe, the above equation can be applied with $p_1$ and $p_2$ being pressures at pipe nodes at each end of a pipe.

Figure 4:
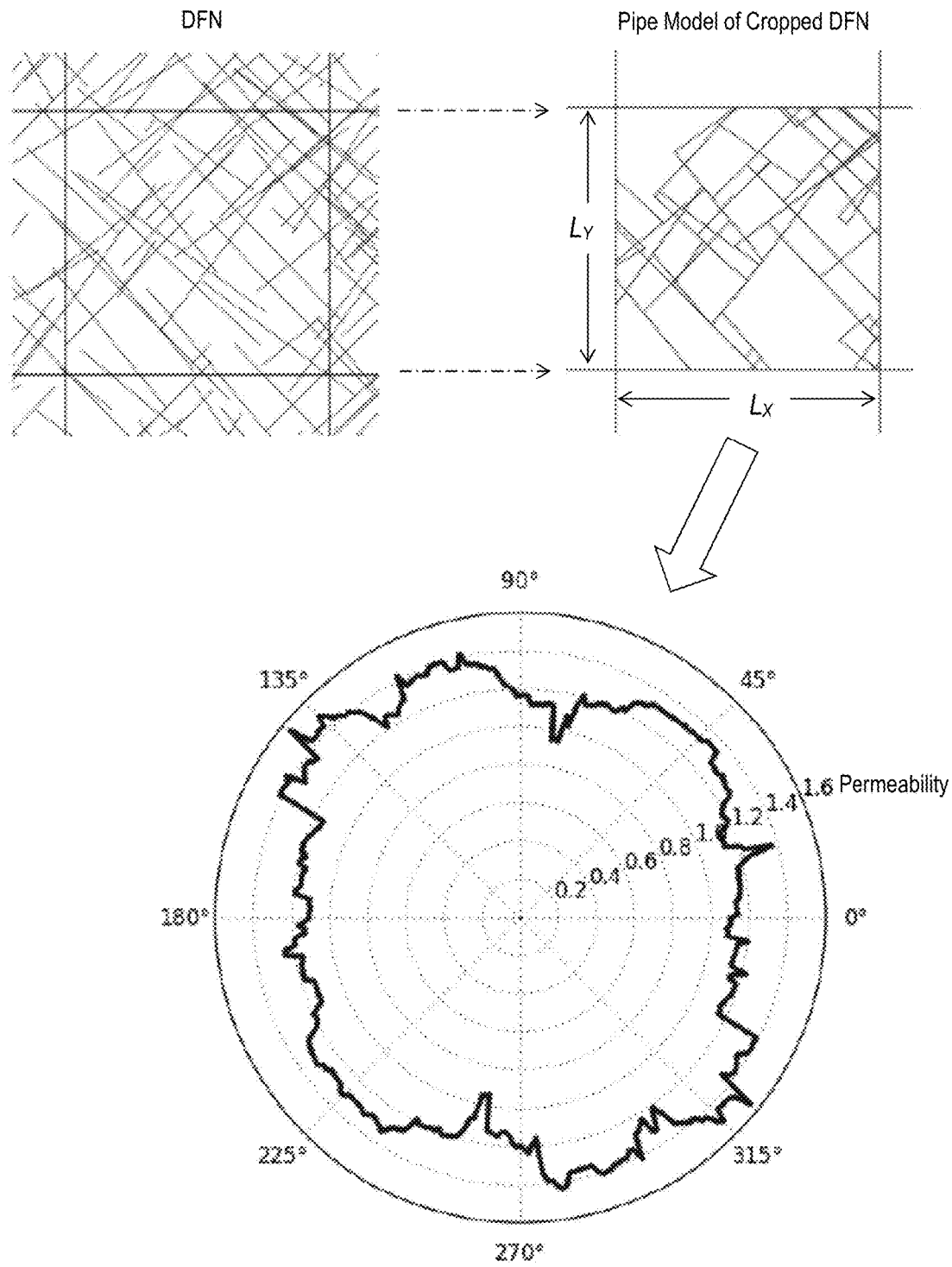
FIG. 4 depicts aspects of an example of implementing the method for estimating a directional permeability of a portion of an earth formation.

Block 39 calls for solving the system of equations for steady-state flow. As noted above, the system of equations is obtained by applying a flow equation, such as the one described above for steady-state volume flux of viscous fluid flowing between two parallel plates, to each pipe or conduit in the pipe model also described above. Because there are multiple pipes or conduits in the pipe model, there are corresponding multiple equations, which form the system of equations. In one or more embodiments, the system of equations is represented mathematically in matrix form and solved using math-solver software as known in the art. Non-limiting examples of math-solver software for solving the system of equations include Symbolic Math Toolbox™ by MathWorks® of Natick, Mass. and NumPy that has functions numpy.linalg.solve( ) and numpy.linalg.lstsq( ), which are both part of the open source project NumPy. In one or more embodiments, the output of the solved system of equations provides the flow rate through each pipe and the pressure at each pipe node to which a boundary condition was not initially applied. The directional permeability of the cropped DFN may be calculated using the following equation. This directional permeability of the cropped DFN may also be referred to as "upscaled" directional permeability because it is upscaled from the individual pipe/conduit micro-level to the cropped DFN macro-level. The direction of the permeability relates to the direction of orientation of the cropped DFN. Permeability is computed as $$\kappa = \frac{\sum Q_i}{L_y} \frac{\mu}{\Delta P / L_x}$$

where $Q_i$ is the volume flux of pipe i that intersects with the boundary along $L_y$, $\mu$ is the fluid viscosity, and $\Delta P$ is the pressure difference across $L_x$ where $L_y$ and $L_x$ are boundary lengths as illustrated in FIG. 4. SI units of k are m².

Figure 5:
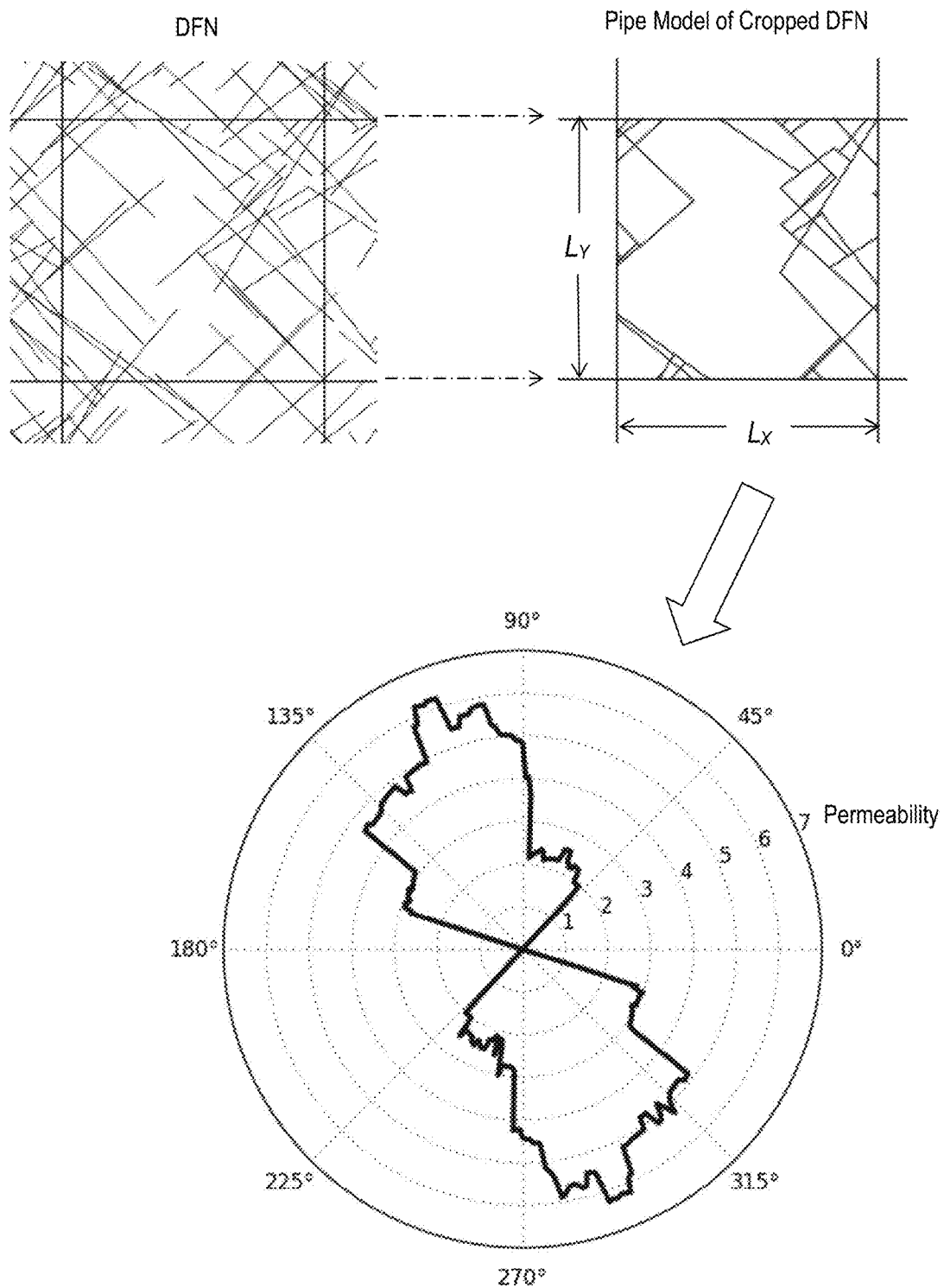
FIG. 5 depicts aspects of another example of implementing the method for estimating a directional permeability of a portion of an earth formation.

If upscaled directional permeability is desired for only one direction, then the steps of the method 30 can be terminated at block 41 skipping block 40 because the upscaled directional permeability has been calculated for the desired direction. If upscaled directional permeability is desired for multiple directions, then the cropped DFN is un-cropped at block 40 and the method blocks 32 through 41 are repeated for each direction of the multiple desired directions. Because the computation in one direction is independent from another direction, this can also be handled in parallel threads. Likewise, the computations for different directions can be performed on separate CPUs or separate computers and the results can be later collected. If the multiple directions are equally distributed from 0 to 360 degrees, then a polar plot of upscaled directional permeability may be obtained such as the one illustrated in the lower part of FIG. 4. If the multiple directions are not equally distributed, a similar plot can be made, or the solid line can be replaced by bars such as are typically used in histograms. FIG. 5 illustrates another example having little or no permeability in a direction denoted with 0 degrees and much greater permeability in a number of directions between 90 and 135 degrees.

The method 30 can also include executing a reservoir simulation on a reservoir simulator using the upscaled directional permeability or permeability values. It can be appreciated that one benefit of the method 30 is that computer resources used to implement the reservoir simulator are conserved resulting in quicker running simulations than if the simulations were run at the pipe/conduit micro-level. Because simulations can run in a lesser amount of time, many more simulations can be run to improve the number of options available to a reservoir engineer.

The method 30 may also include performing a borehole and/or formation-related action using the estimated upscaled directional permeability of the formation associated action-equipment. Non-limiting examples of the borehole and/or formation actions and associated action equipment are presented below.

In one or more embodiments, the method 30 may also include performing actions related to the reservoir such as planning a location for drilling another well and actually drilling the well with drilling equipment such that the new well will be economical. For example, a well may be drilled with a trajectory or geometry that leads to a location having a maximum directional permeability. Another action relates to setting a flow rate for pumping hydrocarbons out of a well using production equipment. It is important to pump hydrocarbons from a well at a flow rate that is large enough to make the well economical but yet at a rate small enough to prevent water from breaching into the hydrocarbon reservoir and ruining the reservoir. Another reservoir action involves using the upscaled directional permeability or permeability values to plan reservoir stimulation treatments such as hydraulic fracturing using hydraulic fracturing equipment. By knowing the permeability is low in a certain direction, the reservoir can be stimulated in areas or volumes related to that direction to increase the permeability in that direction.

The method 30 can also include predicting how much hydrocarbon fluids will flow out of a given well going forward into the future. In one example, a reservoir simulator using the calculated upscaled directional permeability or permeability values is adjusted so that the simulator agrees with past fluid outflows. The adjusted simulator is then used to predict producible amounts of hydrocarbon fluids going forward. The predicted producible amounts of hydrocarbon fluids can then be used to plan and perform hydrocarbon production actions that increase the efficient use of resources. The above reservoir actions are but a few examples of actions that may be performed using the calculated upscaled directional permeability or permeability values. Many other actions are also contemplated.

Figure 8:
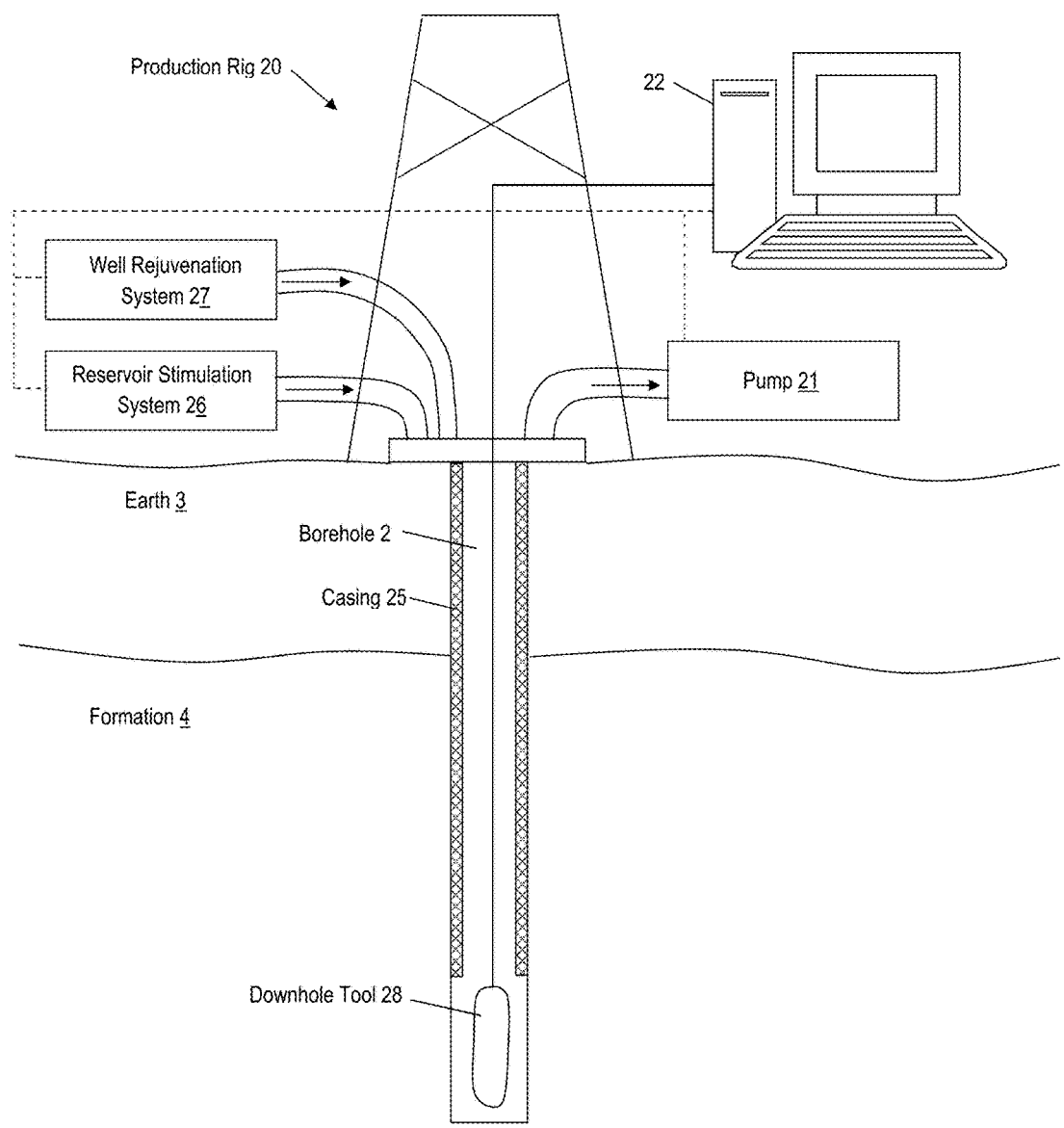
FIG. 8 depicts aspects of production equipment.

FIG. 8 depicts aspects of another embodiment of production equipment for producing hydrocarbons from an earth formation. A production rig 20 is configured to perform actions related to the production of hydrocarbons from the borehole 2 (may also be referred to as a well or wellbore) penetrating the earth 3 having the earth formation 4. For example, the production rig 20 may include a pump 21 configured to pump hydrocarbons entering the borehole 2 to the surface. The formation 4 may contain a reservoir of hydrocarbons that are produced by the production rig 20. The borehole 2 may be lined by a casing 25 to prevent the borehole 2 from collapsing. The production rig 20 may include a reservoir stimulation system 26 configured to stimulate the earth formation 4 to increase the flow of hydrocarbons. In one or more embodiments, the reservoir stimulation system 26 is configured to hydraulically fracture rock in the formation 4.

The production rig 20 may also include a well rejuvenation system 27 configured to rejuvenate the borehole 2 (e.g., increase hydrocarbon flow into the borehole 2). In one or more embodiments, the well rejuvenation system 27 includes an acid treatment system configured to inject acid into the borehole 2.

The production rig 20 may also be configured to log the formation 4 using a downhole tool 28. Non-limiting embodiments of the downhole tool 28 include a resistivity tool, a neutron tool, a gamma-ray tool, a nuclear magnetic resonance (NMR) tool, and an acoustic tool. The downhole tool 28 may be conveyed through the borehole 2 by an armored wireline that also provides communications to the surface. These tools may provide data for imaging a wall of the borehole 2 and thus image fractures in the formation 4 to determine lengths, orientation, and apertures of the fractures. The downhole tool 28 may also be configured to extract a core sample of the formation for analysis at the surface. The surface analysis may also determine lengths, orientation, and apertures of the fractures. The downhole logging and/or the surface analysis may be used to generate a DFN.

FIG. 8 also illustrates a computer processing system 22. The computer processing system 22 is configured to implement the methods disclosed herein. Further, the computer processing system 22 may be configured to act as a controller for controlling operations of the production rig 20 to include well logging and core sample extraction and analysis. Non-limiting examples of control actions include turning equipment on or off and executing processes for formation stimulation and well rejuvenation.

Figure 9:
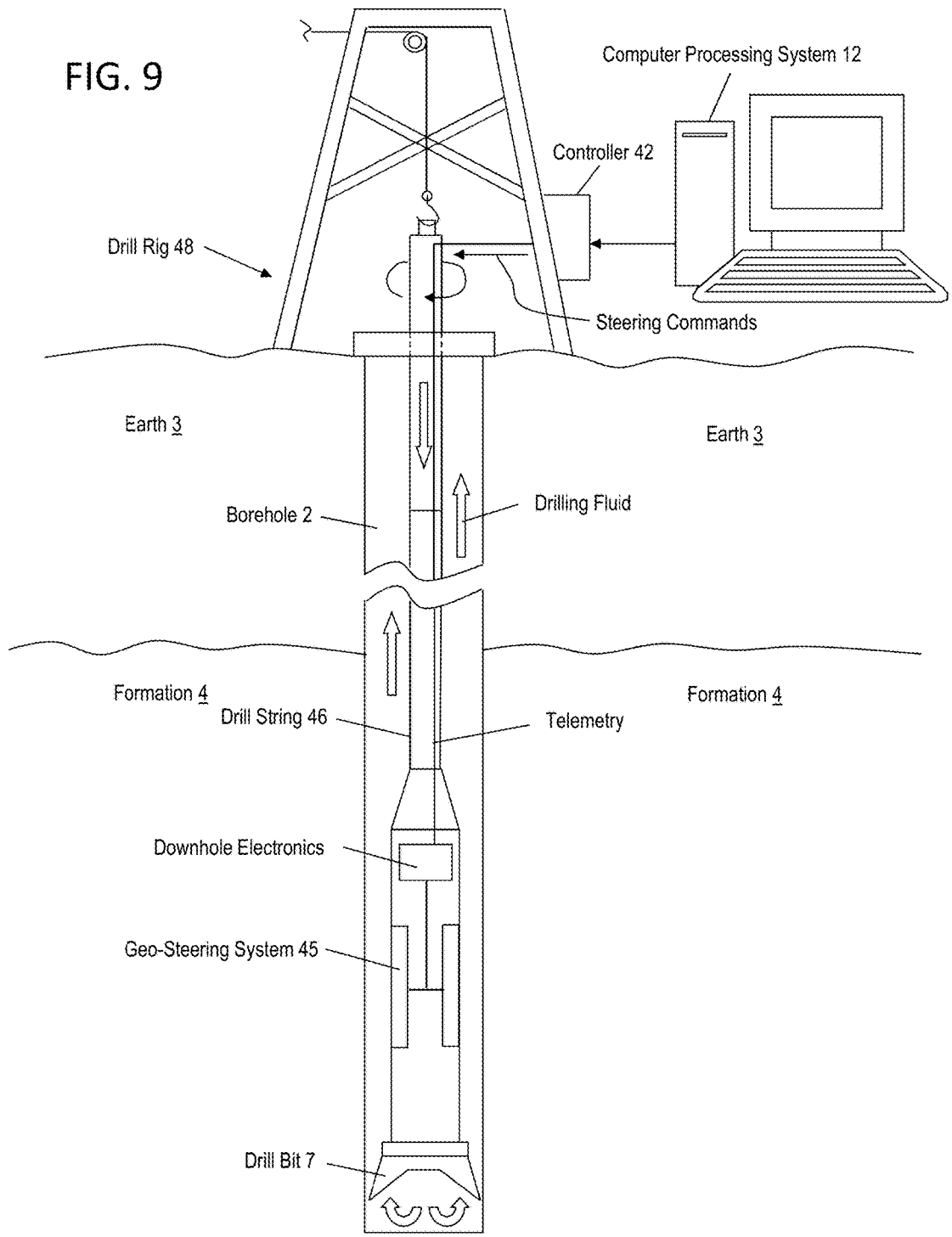
FIG. 9 depicts aspects of drilling equipment.

FIG. 9 depicts aspects of drilling equipment. A drill rig 48 is configured to drill the borehole 2 into the earth 3 according to a desired trajectory or geometry. The drill rig 48 includes a drill string 46 and a drill bit 47 disposed at the distal end the drill string 46. The drill rig 48 is configured to rotate the drill string 46 and thus the drill bit 47 in order to drill the borehole 2. In addition, the drill rig 48 is configured to pump drilling mud (i.e., drill fluid) through the drill string 46 in order to lubricate the drill bit 47 and flush cuttings from the borehole 2. A geo-steering system 45 is coupled to the drill string 46 and is configured to steer the drill bit 47 in order to drill the borehole 2 according to the desired trajectory. A controller 42 is configured to control operations of the drill rig 48 to include controlling the geo-steering system 45. In one or more embodiments, the geo-steering system can control the direction of drilling by exerting a force on the borehole wall using extendable pads. The computer processing system 22 may provide inputs into the controller 42 based upon the estimated upscaled directional permeability. In one or more embodiments, the computer processing system may receive updates of the DFN from data provided by downhole tools in real time and, thus, estimate the upscaled directional permeability and provide inputs to the controller 42 in real time.

Set forth below are some embodiments of the foregoing disclosure:

Embodiment 1

A method for estimating an upscaled directional permeability of an earth formation, the method comprising: receiving a discrete fracture network (DFN) representing the earth formation, the DFN comprising a plurality of rock fractures and a location, size, orientation and aperture of each of the rock fractures; aligning the DFN in a desired orientation or direction; cropping the DFN to a desired size having boundaries; identifying a fracture plane or fracture planes that are connected with each other and establish a path between the boundaries of the cropped DFN; creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary; creating a system of equations representing flows through the conduits; applying boundary conditions to the system of equations; solving the system of equations for steady-state flow to estimate the upscaled directional permeability of the formation; iterating the aligning, cropping, identifying, creating a pipe model, creating a system of equations, applying and solving for another desired orientation or direction in response to a signal indicating the upscaled directional permeability is to be estimated for the another desired orientation or direction; performing a borehole and/or formation-related action using the estimated upscaled directional permeability of the formation and associated action-equipment; wherein the aligning, cropping, identifying, creating a pipe model, creating a system of equations, applying, solving and iterating are performed using a processor.

Embodiment 2

The method according to claim 1, wherein cropping comprises cropping the DFN to a selected area or volume having at least four intersecting boundary lines.

Embodiment 3

The method according to claim 1, wherein the node is placed at a midpoint along a complete length of the intersection of the fracture planes.

Embodiment 4

The method according to claim 1, wherein the system of equations models fluid flow through a slot formed between two parallel plates separated by an aperture distance a.

Embodiment 5

The method according to claim 4, wherein the system of equations comprises the following equation:

$$Q = \frac{1}{12\mu} \frac{(p_1 - p_2)}{l} a^3$$

where $\mu$ is the fluid viscosity, $p_1$ and $p_2$ are the pressures on either side or end of the slot defined by the parallel plates, $l$ is the length of the plates in flow direction, and $a$ is the distance between the two plates.

Embodiment 6

The method according to claim 1, wherein applying boundary conditions comprises setting a pressure at a node.

Embodiment 7

The method according to claim 1, wherein a node at a boundary comprises one or more nodes at one boundary and one or more nodes at another boundary.

Embodiment 8

The method according to claim 1, wherein solving the system of equations for steady-state flow comprises providing a flow rate through each of the conduits in the pipe model and a pressure at each node.

Embodiment 9

The method according to claim 8, wherein solving the system of equations for steady-state flow to estimate the upscaled directional permeability of the formation further comprises using the following equation for the cropped DFN:

$$\kappa = \frac{\sum Q_i}{L_y} \frac{\mu}{\Delta P / L_x}$$

where $Q_i$ is the volume flux of conduit i that intersects with the boundary along $L_y$, $\mu$ is the fluid viscosity, and $\Delta P$ is the pressure difference across $L_x$ where $L_y$ and $L_x$ are boundary lengths.

Embodiment 10

The method according to claim 1, wherein the upscaled directional permeability comprises a plurality of upscaled directional permeability values for a plurality of orientations or directions.

Embodiment 11

The method according to claim 10, further comprising plotting a polar plot illustrating the plurality of upscaled directional permeability values for a plurality of orientations or directions.

Embodiment 12

The method according to claim 1, wherein the borehole and/or formation-related action comprises controlling a flow rate of fluids extracted from a borehole using a controller.

Embodiment 13

The method according to claim 1, wherein the borehole and/or formation-related action comprises stimulating the formation using a reservoir stimulation system Embodiment 14

The method according to claim 1, wherein the borehole and/or formation-related action comprises drilling a borehole with a trajectory that leads to a location in the formation having a maximum directional permeability value using a drill rig.

Embodiment 15

A system for estimating an upscaled directional permeability of a formation, the system comprising: a memory having computer-readable instructions; a processor for executing the computer-readable instructions, the computer-readable instructions comprising: receiving a discrete fracture network (DFN), the DFN a plurality of rock fractures and a location, size, orientation and aperture of each of the rock fractures; aligning the DFN in a desired orientation or direction; cropping the DFN to a desired size having boundaries; identifying a fracture plane or fracture planes that are connected with each other and establish a path between the boundaries of the cropped DFN; creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary; creating a system of equations representing flows through the conduits; applying boundary conditions to the system of equations; solving the system of equations for steady-state flow to estimate the upscaled directional permeability of the formation; and iterating the aligning, cropping, identifying, creating a pipe model, creating a system of equations, applying and solving for another desired orientation or direction in response to a signal indicating the upscaled directional permeability is to be estimated for the another desired orientation or direction; equipment configured to perform a borehole and/or formation-related action using the estimated upscaled directional permeability of the formation.

Embodiment 16

The system according to claim 15, wherein the upscaled directional permeability comprises a plurality of upscaled directional permeability values for a plurality of orientations or directions.

Embodiment 17

The system according to claim 16, wherein the computer-readable instructions further comprise plotting a polar plot illustrating the plurality of upscaled directional permeability values for a plurality of orientations or directions.

Embodiment 18

The system according to claim 15, wherein the borehole and/or formation-related action comprises controlling a flow rate of fluids extracted from a borehole and the equipment comprises a controller.

Embodiment 19

The system according to claim 15, wherein the borehole and/or formation-related action comprises stimulating the formation and the equipment comprises a reservoir stimulation system.

Embodiment 20

The system according to claim 15, wherein the borehole and/or formation-related action comprises drilling a borehole with a trajectory that leads to a location in the formation having a maximum directional permeability value and the equipment comprises a drill rig.

In support of the teachings herein, various analysis components may be used including a digital and/or an analog system. For example, the controller 10 and/or 42, the computer processing system 11 and/or 22, and/or the geo-steering system 45 may include digital and/or analog systems. The system may have components such as a processor, storage media, memory, input, output, communications link (wired, wireless, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure. Processed data such as a result of an implemented method may be transmitted as a signal via a processor output interface to a signal receiving device. The signal receiving device may be a display monitor or printer for presenting the result to a user. Alternatively or in addition, the signal receiving device may be memory or a storage medium. It can be appreciated that storing the result in memory or the storage medium will transform the memory or storage medium into a new state (containing the result) from a prior state (not containing the result). Further, an alert signal may be transmitted from the processor to a user interface if the result exceeds a threshold value.

Further, various other components may be included and called upon for providing for aspects of the teachings herein. For example, a sensor, transmitter, receiver, transceiver, antenna, controller, optical unit, electrical unit or electro-mechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for estimating an upscaled directional permeability of an earth formation, the method comprising:
    receiving a discrete fracture network (DFN) representing the earth formation, the DFN comprising a plurality of rock fractures and a location, size, orientation and aperture of each of the rock fractures;
    aligning the DFN in a desired orientation or direction;
    cropping the DFN to a desired size having boundaries;
    identifying a fracture plane or fracture planes that are connected with each other and establish a path between the boundaries of the cropped DFN;
    creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary;
    creating a system of equations representing flows through the conduits;
    applying boundary conditions to the system of equations;
    solving the system of equations for steady-state flow to estimate the upscaled directional permeability of the formation;
    iterating the aligning, cropping, identifying, creating a pipe model, creating a system of equations, applying and solving for another desired orientation or direction in response to a signal indicating the upscaled directional permeability is to be estimated for the another desired orientation or direction;
    performing a borehole and/or formation-related action using the estimated upscaled directional permeability of the formation and associated action-equipment;

wherein the aligning, cropping, identifying, creating a pipe model, creating a system of equations, applying, solving and iterating are performed using a processor.

2. The method according to claim 1, wherein cropping comprises cropping the DFN to a selected area or volume having at least four intersecting boundary lines.

3. The method according to claim 1, wherein the node is placed at a midpoint along a complete length of the intersection of the fracture planes.

4. The method according to claim 1, wherein the system of equations models fluid flow through a slot formed between two parallel plates separated by an aperture distance a.

5. The method according to claim 4, wherein the system of equations comprises the following equation:

$$Q = \frac{1}{12\mu} \frac{(p_1 - p_2)}{l} a^3$$

where $\mu$ is the fluid viscosity, $p_1$ and $p_2$ are the pressures on either side or end of the slot defined by the parallel plates, l is the length of the plates in flow direction, and a is the distance between the two plates.

6. The method according to claim 1, wherein applying boundary conditions comprises setting a pressure at a node.

7. The method according to claim 1, wherein a node at a boundary comprises one or more nodes at one boundary and one or more nodes at another boundary.

8. The method according to claim 1, wherein solving the system of equations for steady-state flow comprises providing a flow rate through each of the conduits in the pipe model and a pressure at each node.

9. The method according to claim 8, wherein solving the system of equations for steady-state flow to estimate the upscaled directional permeability of the formation further comprises using the following equation for the cropped DFN:

$$\kappa = \frac{\sum Q_i}{L_y} \frac{\mu}{\Delta P / L_x}$$

where $Q_i$ is the volume flux of conduit i that intersects with the boundary along $L_y$, $\mu$ is the fluid viscosity, and $\Delta P$ is the pressure difference across $L_x$ where $L_y$ and $L_x$ are boundary lengths.

10. The method according to claim 1, wherein the upscaled directional permeability comprises a plurality of upscaled directional permeability values for a plurality of orientations or directions.

11. The method according to claim 10, further comprising plotting a polar plot illustrating the plurality of upscaled directional permeability values for a plurality of orientations or directions.

12. The method according to claim 1, wherein the borehole and/or formation-related action comprises controlling a flow rate of fluids extracted from a borehole using a controller.

13. The method according to claim 1, wherein the borehole and/or formation-related action comprises stimulating the formation using a reservoir stimulation system.

14. The method according to claim 1, wherein the borehole and/or formation-related action comprises drilling a borehole with a trajectory that leads to a location in the formation having a maximum directional permeability value using a drill rig.

15. A system for estimating an upscaled directional permeability of a formation, the system comprising:
a memory having computer-readable instructions;
a processor for executing the computer-readable instructions, the computer-readable instructions comprising:
receiving a discrete fracture network (DFN), the DFN a plurality of rock fractures and a location, size, orientation and aperture of each of the rock fractures;
aligning the DFN in a desired orientation or direction;
cropping the DFN to a desired size having boundaries;
identifying a fracture plane or fracture planes that are connected with each other and establish a path between the boundaries of the cropped DFN;
creating a pipe model of the identified fracture or fractures, the pipe model comprising a node at an intersection of fracture planes and a conduit connecting two nodes together such that one or more conduits alone or in combination establish the path between the boundaries of the cropped DFN, the pipe model further comprising a node at each conduit intersecting a boundary;
creating a system of equations representing flows through the conduits;
applying boundary conditions to the system of equations;
solving the system of equations for steady-state flow to estimate the upscaled directional permeability of the formation; and
iterating the aligning, cropping, identifying, creating a pipe model, creating a system of equations, applying and solving for another desired orientation or direction in response to a signal indicating the upscaled directional permeability is to be estimated for the another desired orientation or direction;
equipment configured to perform a borehole and/or formation-related action using the estimated upscaled directional permeability of the formation.

16. The system according to claim 15, wherein the upscaled directional permeability comprises a plurality of upscaled directional permeability values for a plurality of orientations or directions.

17. The system according to claim 16, wherein the computer-readable instructions further comprise plotting a polar plot illustrating the plurality of upscaled directional permeability values for a plurality of orientations or directions.

18. The system according to claim 15, wherein the borehole and/or formation-related action comprises controlling a flow rate of fluids extracted from a borehole and the equipment comprises a controller.

19. The system according to claim 15, wherein the borehole and/or formation-related action comprises stimulating the formation and the equipment comprises a reservoir stimulation system.

20. The system according to claim 15, wherein the borehole and/or formation-related action comprises drilling a borehole with a trajectory that leads to a location in the formation having a maximum directional permeability value and the equipment comprises a drill rig.

* * * * *